United States Patent
Tsai et al.

(10) Patent No.: US 8,900,989 B2
(45) Date of Patent: Dec. 2, 2014

(54) METHOD OF FABRICATING AN AIR GAP USING A DAMASCENE PROCESS AND STRUCTURE OF SAME

(71) Applicant: Taiwan Semiconductor Manufacturing Company, Ltd., Hsin-Chu (TW)

(72) Inventors: Cheng-Hsiung Tsai, Chunan Town (TW); Chung-Ju Lee, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/787,524

(22) Filed: Mar. 6, 2013

(65) Prior Publication Data

US 2014/0252633 A1    Sep. 11, 2014

(51) Int. Cl.
| | | |
|---|---|---|
| H01L 21/4763 | (2006.01) | |
| H01L 23/12 | (2006.01) | |
| H01L 23/48 | (2006.01) | |
| H01L 21/768 | (2006.01) | |
| H01L 23/522 | (2006.01) | |
| H01L 23/532 | (2006.01) | |

(52) U.S. Cl.
CPC .......... H01L 23/48 (2013.01); H01L 21/76841 (2013.01); H01L 21/76898 (2013.01); H01L 23/5226 (2013.01); H01L 21/76831 (2013.01); H01L 21/76877 (2013.01); H01L 23/53295 (2013.01); H01L 21/76843 (2013.01); H01L 23/481 (2013.01)
USPC .......... 438/620; 438/622; 438/633; 438/638; 257/700; 257/701; 257/758

(58) Field of Classification Search
CPC ...................... H01L 21/7682; H01L 21/76831; H01L 21/76807; H01L 21/76898; H01L 21/76802; H01L 21/76877; H01L 21/76843; H01L 23/53295; H01L 23/481; H01L 23/5329; H01L 23/5226
See application file for complete search history.

(56) References Cited

U.S. PATENT DOCUMENTS

| | | | | |
|---|---|---|---|---|
| 7,253,095 | B2 * | 8/2007 | Lur et al. ...................... | 438/619 |
| 7,579,233 | B2 * | 8/2009 | Hwang ......................... | 438/239 |
| 7,595,555 | B2 * | 9/2009 | Clarke et al. .................. | 257/758 |
| 7,649,239 | B2 * | 1/2010 | Hussein et al. ............... | 257/522 |
| 7,671,442 | B2 * | 3/2010 | Anderson et al. ............. | 257/522 |
| 2003/0183940 | A1 * | 10/2003 | Noguchi et al. .............. | 257/767 |
| 2004/0121577 | A1 * | 6/2004 | Yu et al. ........................ | 438/622 |
| 2004/0232552 | A1 * | 11/2004 | Wang et al. ................... | 257/758 |
| 2005/0275104 | A1 * | 12/2005 | Stamper ........................ | 257/758 |
| 2009/0008791 | A1 * | 1/2009 | Clevenger et al. ............ | 257/774 |
| 2011/0266511 | A1 * | 11/2011 | Shen et al. ........................ | 257/3 |

(Continued)

*Primary Examiner* — Alonzo Chambliss
(74) *Attorney, Agent, or Firm* — Slater & Matsil, LLP (57) ABSTRACT

The present disclosure provides a method for forming a semiconductor device. The method includes forming first conductive layer structures in a first dielectric layer on a substrate; forming a patterned photoresist layer having portions that are each disposed over a respective one of the first conductive layer structures; forming an energy removable film (ERF) on the sidewalls of each of the portions; forming a second dielectric layer over the ERFs, the portions of the patterned photoresist layer, and the first dielectric layer; removing the portions to leave behind a plurality of openings; filling a conductive material in the openings, the conductive material defining second conductive layer structures; forming a ceiling layer over the second conductive layer structures, the ERFs, and the second dielectric layer; and applying energy to the ERFs to partially remove the ERFs on the sidewalls of the portions thereby forming air gaps.

20 Claims, 6 Drawing Sheets

(56) References Cited

U.S. PATENT DOCUMENTS

| | | |
|---|---|---|
| 2012/0013022 A1* | 1/2012 | Sabuncuoglu Tezcan et al. .............................. 257/774 |
| 2012/0126413 A1* | 5/2012 | Braeckelmann et al. ...... 257/773 |
| 2014/0027908 A1* | 1/2014 | Tsai et al. ..................... 257/751 |
| 2014/0117561 A1* | 5/2014 | Singh et al. ................... 257/774 |

* cited by examiner

METHOD OF FABRICATING AN AIR GAP USING A DAMASCENE PROCESS AND STRUCTURE OF SAME

BACKGROUND

In semiconductor technology, an integrated circuit can be formed on a semiconductor substrate according to a particular technology node, which typically indicates a minimum feature size. When the minimum feature size moves to about 100 nm or below, damascene processes are frequently utilized to form multilayer copper interconnections including vertical interconnection vias and horizontal interconnection metal lines. In such damascene processes, it is often desirable to use low dielectric constant (low-k) materials to form interlayer dielectrics. One way to form such low-k dielectric materials is to provide air gaps in the material. However, one concern is that the air gap can collapse in large spacing regions, thereby causing performance and quality issues of the integrated circuit. Therefore, what is needed is a structure with reduced air gap collapse and improved performance, and a method of making the same.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
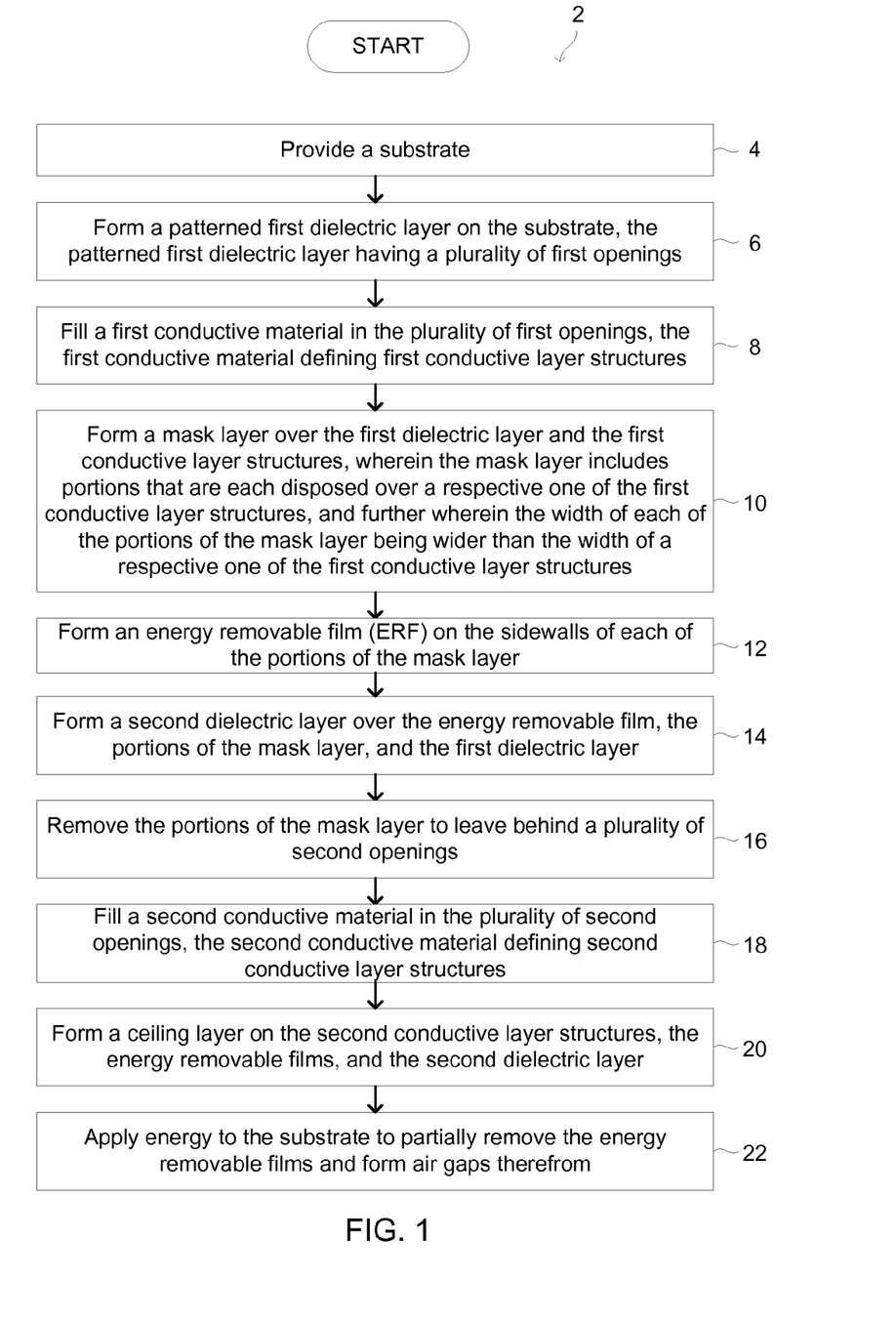
FIG. 1 is a flowchart of a method of fabricating a semiconductor device according to various embodiments of the present disclosure.

FIG. 1 is a flowchart of a method 2 for fabricating a semiconductor device according to various aspects of the present disclosure. Referring to FIG. 1, the method 2 includes block 4, in which a substrate is provided. The method 2 includes block 6, in which a patterned first dielectric layer is formed on the substrate. The patterned first dielectric layer has a plurality of first openings. The method 2 includes block 8, in which a first conductive material is filled in the plurality of first openings, the first conductive material defining first conductive layer structures. The method 2 includes block 10, in which a mask layer is formed over the first dielectric layer and the first conductive layer structures. The mask layer includes portions that are each disposed over a respective one of the first conductive layer structures. The width of each of the portions are wider than the width of a respective one of the first conductive layer structures. The method 2 includes block 12, in which an energy removable film (ERF) is formed on the sidewalls of each of the portions of the mask layer. The method 2 includes block 14, in which a second dielectric layer is formed over the energy removable film, the portions of the mask layer, and the first dielectric layer. The method 2 includes block 16, in which the portions of the mask layer are removed to leave behind a plurality of second openings. The method 2 includes block 18, in which a second conductive material is filled in the plurality of second openings, the second conductive material defining second conductive layer structures. The method 2 continues to block 20, in which a ceiling layer is formed on the second conductive layer structures, the energy removable films, and the second dielectric layer. The method 2 includes block 22, in which an energy is applied to the substrate to partially remove the energy removable film to form air gaps therefrom.

It is understood that additional processes may be performed before, during, or after the blocks 4-22 shown in FIG. 1 to complete the fabrication of the semiconductor device, but these additional processes are not discussed herein in detail for the sake of simplicity.

FIGS. 2-12 are diagrammatic fragmentary cross-sectional side views of a semiconductor device at various fabrication stages according to embodiments of the method 2 of FIG. 1. It is understood that FIGS. 2-12 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
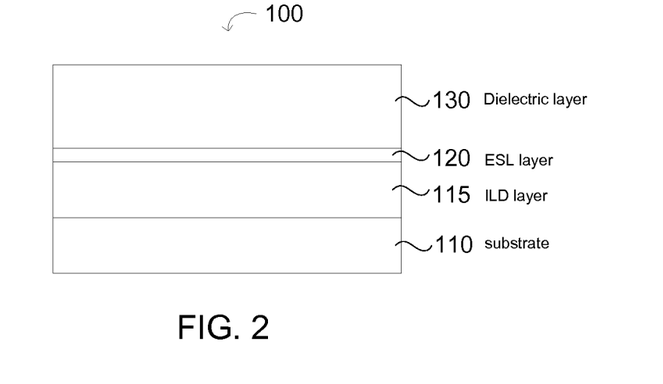
FIGS. 2-12 are diagrammatic cross-sectional side views of a portion of a semiconductor device at various stages of fabrication in accordance with various embodiments of the present disclosure.

Referring to FIG. 2, a semiconductor device 100 is provided. The semiconductor device 100 may be an integrated circuit (IC) chip, system on chip (SOC), or portion thereof, that may include various passive and active microelectronic devices such as resistors, capacitors, inductors, diodes, metal-oxide semiconductor field effect tansistors (MOSFET), complementary metal-oxide semiconductor (CMOS) transistors, bipolar junction transistors (BJT), laterally diffused MOS (LDMOS) transistors, high power MOS transistors, or other types of transistors. The semiconductor device 100 includes a substrate 110. The substrate 110 may be a portion of a semiconductor wafer. For example, the substrate may include silicon. The substrate 110 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In one embodiment, the substrate 110 includes various doped features for various microelectronic components, such as a complementary metal oxide semiconductor field-effect transistor (CMOSFET), imaging sensor, memory cell, and/or capacitive element.

In some embodiments, an interlayer dielectric (ILD) layer 115 is formed on the substrate 110. The ILD layer 115 includes a dielectric material, for example undoped silicate glass (USG) or phosphosilicate glass (PSG). The ILD layer 115 may include other suitable materials.

A conductive layer (not shown) is formed over the ILD layer 115. The conductive layer may also be referred to as a metal layer and includes a conductive material. In an embodiment, the conductive material is copper.

A material layer 120 is formed over the ILD layer 115 and/or the conductive layer. The material layer 120 may be an etch stop layer, and hence is alternatively referred to as etch stop layer 120 hereinafter. The etch stop layer 120 may have a proper thickness such that a following etching process used for via formation is able to properly stop on the etch stop layer 120 with enough etching margin. The etch stop layer 120 may include silicon nitride, silicon oxynitride, silicon carbide, silicon carbide nitride, other suitable materials, or a combination thereof.

A first dielectric layer 130 is formed on the etch stop layer 120 as shown in FIG. 2. The first dielectric layer 130 includes silicon oxide, silicon nitride, a low dielectric constant (low-k) material, or a combination thereof. The low-k material may include fluorinated silica glass (FSG), carbon doped silicon oxide, Xerogel, Aerogel, amorphous fluorinated carbon, Parylene, BCB (bis-benzocyclobutenes), polyimide, and/or other materials, for example. A process of forming the first dielectric layer 130 may utilize a CVD or a spin-on coating process. The first dielectric layer 130 may include a thickness ranging between about 50 angstroms and about 2000 angstroms. It is understood that the dimensions recited are merely examples, and will change with the down scaling of integrated circuits.

Figure 3:
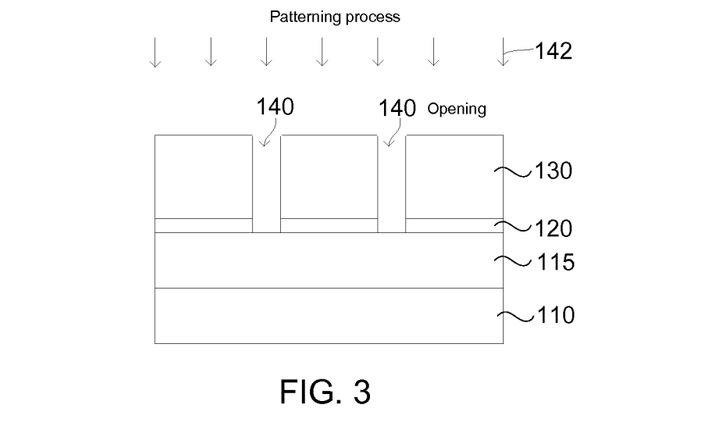

Referring now to FIG. 3, a patterning process 142 is performed on the semiconductor device 100 to form a plurality of first openings (or vias) 140 in the first dielectric layer 130 stopping on the etch stop layer 120, according to one embodiment. The patterning process 142 may include forming a patterned photoresist layer (not illustrated) using a process such as photolithography, immersion lithography, ion-beam writing, or other suitable processes. For example, the photolithography process may include spin-coating, soft-baking, exposure, post-baking, developing, rinsing, drying, and other suitable processes. The patterning process 142 may also include an etching process in which the patterned photoresist layer may be used as a mask to etch openings in the first dielectric layer 130.

For the sake of simplicity, only first openings 140 are illustrated herein, though it is understood that many other openings are formed. Each of the first openings 140 is approximately aligned (vertically) with a respective one of the underlying conductive layer in the substrate.

Figure 4:
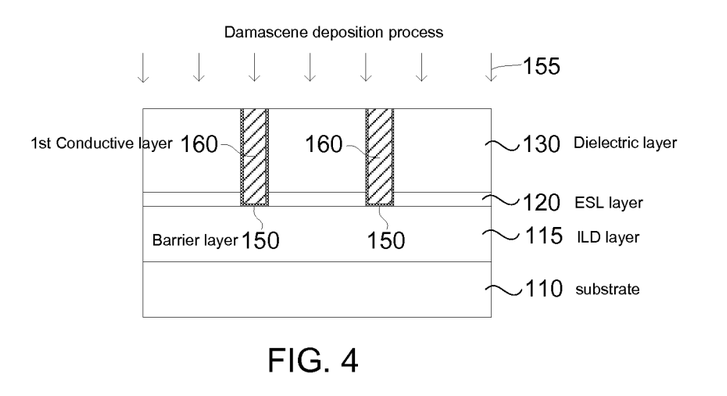

Referring now to FIG. 4, a deposition process is performed to form a diffusion barrier layer 150 over the first dielectric layer 130. The diffusion barrier layer 150 is formed on the top and in the openings of the first dielectric layer 130. As illustrated in FIG. 4, the portions of diffusion barrier layer 150 deposited on top surface of first dielectric layer 130 are removed in a subsequent step, which is discussed further below. The diffusion barrier layer 150 blocks diffusion of metal layer structures into adjacent dielectric material. In an exemplary embodiment, the deposition process includes a chemical vapor deposition (CVD) process. In another embodiment, the deposition includes an atomic layer deposition (ALD) process. The diffusion barrier layer 150 includes a conductive material. In an embodiment, the conductive material is selected from the group consisting of: tantalum (Ta), tantalum nitride (TaNx), titanium (Ti), titanium nitride (TiNx), manganese oxide (MnOx), and combinations thereof. In an embodiment, the diffusion barrier layer 150 has a thickness that is less than about 50 angstroms. In some embodiments, an adhesion layer and/or a copper seed layer are formed in the openings of the first dielectric layer 130.

Still referring to FIG. 4, a damascene deposition process 155 is performed on the semiconductor device 100. The damascene deposition process 155 deposits a conductive material in the first openings 140 of the first dielectric layer 130. The conductive material may be additionally disposed above and on the first dielectric layer 130. In one embodiment, the conductive material is copper. In other embodiments, the conductive material may include copper, copper alloy, tungsten, titanium, titanium nitride, or combinations thereof. In one embodiment, the damascene process 155 includes an electroless deposition (ELD) process. In another embodiment, the damascene deposition process 155 includes an electroplating process (ECP). A planarization process that includes a chemical mechanical polishing (CMP) process is subsequently performed after the damascene deposition process 155 so that the top of the conductive material is co-planar with the top of the first dielectric layer 130. This process also removes portions of diffusion barrier layer that were formed on the top surface of first dielectric layer 130. The planarization process may alternatively or collectively include an etch back process or other suitable process. As a result of the damascene process and the subsequent CMP process, a plurality of first conductive layer structures 160 are formed in the first openings 140.

Figure 5:
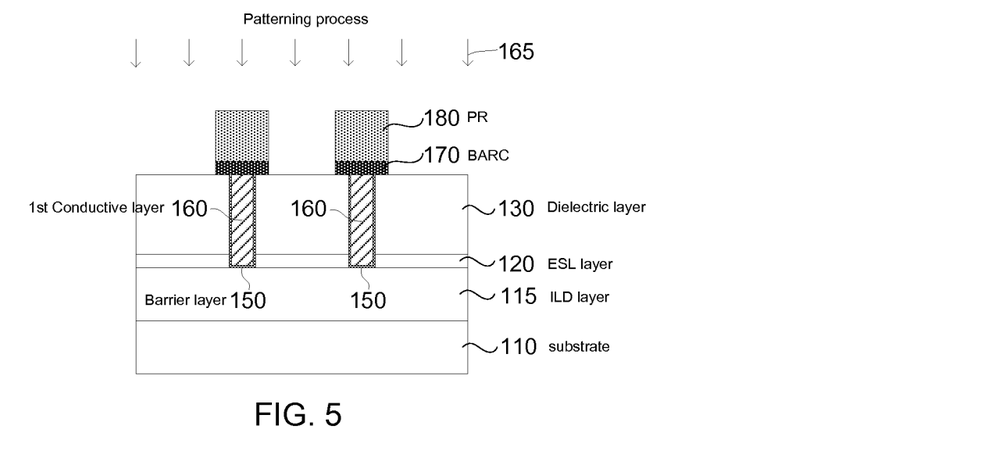

Referring now to FIG. 5, a patterning process 165 is performed on the semiconductor device 100 to form a mask layer over the first dielectric layer 130 and the first conductive layer structures 160. In one embodiment, the mask layer includes a photoresist material, which is patterned using a photolithography process similar to that discussed above with reference to FIG. 3. The mask layer or the patterned photoresist material layer includes portions 180 that are each disposed over a respective one of the first conductive layer structures 160. In some embodiments, the portions 180 each includes a bottom anti-reflective coating (BARC) layer 170. In some embodiments, the width of each of the mask layer portions 180 is wider than the width of a respective one of the first conductive layer structures 160. While only two dimensions are illustrated in the cross-section views of the figures (e.g., the x-y plane), those skilled in the art will recognize that mask layer portions 180 may also be wider than the respective width of first conductive layer structures 160 in the non-illustrated direction, i.e. the x-z plane extending into and out of the plane of the page). In another embodiment, the mask layer includes a dielectric material, for example silicon oxide, silicon nitride, and the like, which can be patterned by a patterned photoresist layer to form the portions 180. In a later process, the portions 180 are removed to form openings or trenches in the semiconductor device 100.

Figure 6:
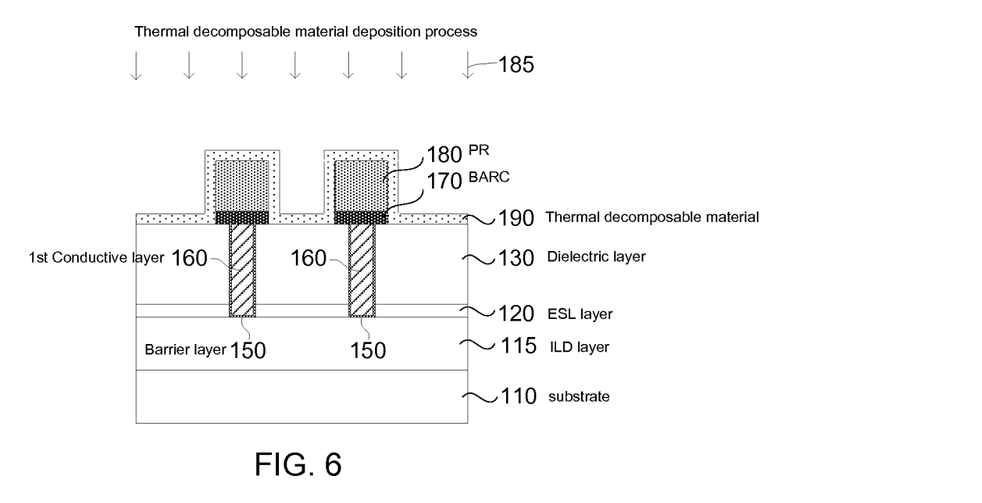

With reference now to FIG. 6, a thermal decomposable material deposition process 185 is performed on the semiconductor device 100 to form an energy removal film (ERF) 190 on the first dielectric layer 130 and on the top and sidewalls of the mask layer portions 180. The energy removal film 190 uses an energy removal material. The energy removal material is a material decomposable upon being exposed to proper energy such as ultraviolet (UV), X-ray, infrared, visual light, thermal energy, electron-beam (e-beam), and/or other proper energy sources. For example, one energy removal material is decomposable to e-beam with electron energy ranging between about 100 eV and about 500 KeV. The energy removal material includes a photonic decomposable material, a thermal decomposable material, and an e-beam decomposable material. In one embodiment, the ERF 190 includes an organic compound. In another embodiment, the ERF 190 includes a silicon-based CxHy compound. In yet another embodiment, the ERF 190 includes a thermal decomposable polymer such as, for example P (neopentyl methacrylate-co-ethylene glycol dimethacrylate) copolymer, abbreviated as P (npMAco-EGDA). The ERF 190 may have a thickness ranging between about 50 angstroms and about 1000 angstroms. The ERF 190 may be formed by a suitable process such as chemical vapor deposition (CVD).

Figure 7:
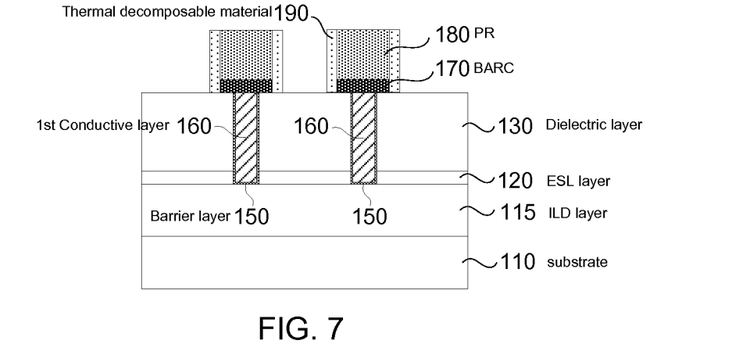

An etch back process or other suitable process removes the ERF 190 on the top of the mask layer portions 180 and the top of the first dielectric layer 130, leaving the ERF 190 on the sidewalls of each of the portions 180 of the mask layer, as illustrated in FIG. 7.

Figure 8:
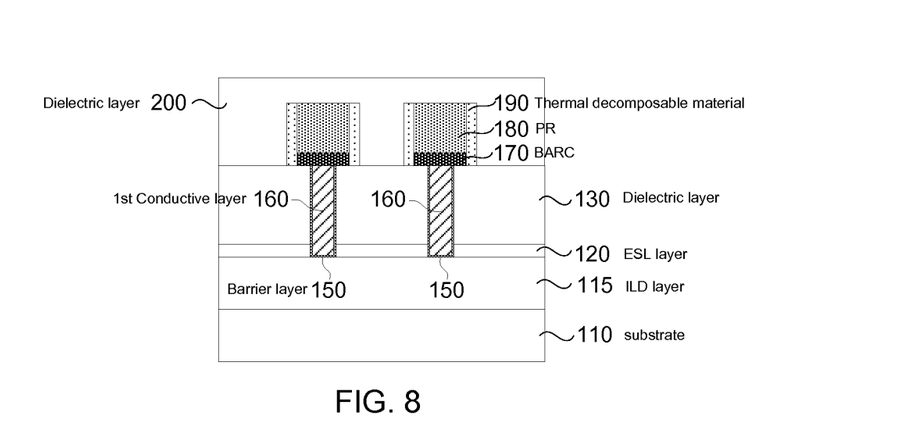

A second dielectric layer 200 is formed over the energy removable film 190, the portions 180 of the hard mask layer, and the first dielectric layer 130, as shown in FIG. 8. The second dielectric layer 200 includes silicon oxide, silicon nitride, a low dielectric constant (low-k) material, or a combination thereof. The low-k material may include fluorinated silica glass (FSG), carbon doped silicon oxide, Xerogel, Aerogel, amorphous fluorinated carbon, Parylene, BCB (bis-benzocyclobutenes), polyimide, and/or other materials, for example. A process of forming the second dielectric layer 200 may utilize a CVD or a spin-on coating process. The second dielectric layer 200 may include a thickness ranging between about 50 angstroms and about 2000 angstroms. It is understood that the dimensions recited are merely examples, and will change with the down scaling of integrated circuits. In one embodiment, the second dielectric layer 200 has a porous structure so that air gaps can be properly formed in later steps. In one embodiment, the second dielectric layer 200 has a porous structure with a porosity ranging between about 0.5% and about 80%. The second dielectric layer 200 uses silicon nitride with a proper porous structure and a dielectric constant ranging between about 3 and about 4, according to one embodiment. The precursor used to form porous silicon nitride by a CVD process may include more organic material to enhance the formation of porosity.

Figure 9:
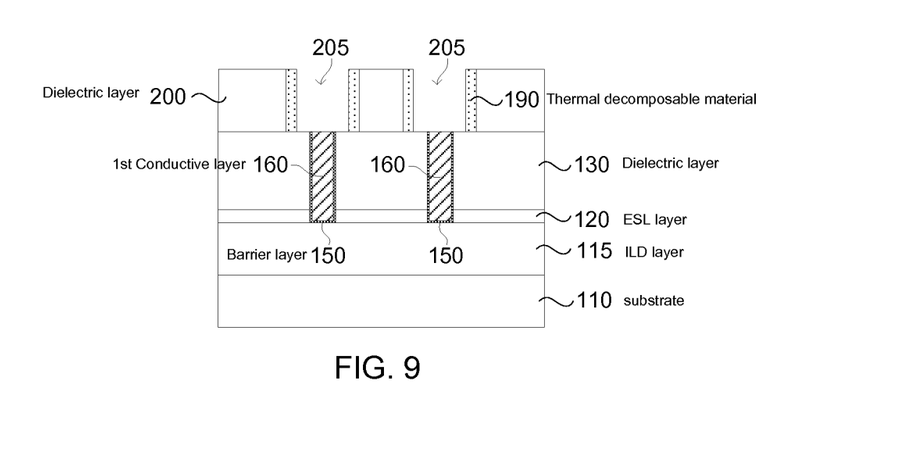

In a further step as shown in FIG. 9, portions of the second dielectric layer 200 and the portions 180 of the hard mask layer are removed to leave behind a plurality of second openings 205 in the second dielectric layer 200. In some embodiments, where the portions 180 each includes a bottom anti-reflective coating (BARC) layer 170, the BARC layer 170 is also removed. In one embodiment, a low-k etch back process is used to remove portions of the second dielectric layer 200, as is well known in the art. In an embodiment where the portions 180 of the mask layer is a patterned photoresist layer, the patterned photoresist layer is removed by stripping. In an exemplary embodiment, the patterned photoresist layer is stripped using a plasma etching process, as is well known in the art. In an alternative embodiment, the patterned photoresist layer is stripped using a wet etch process.

Figure 10:
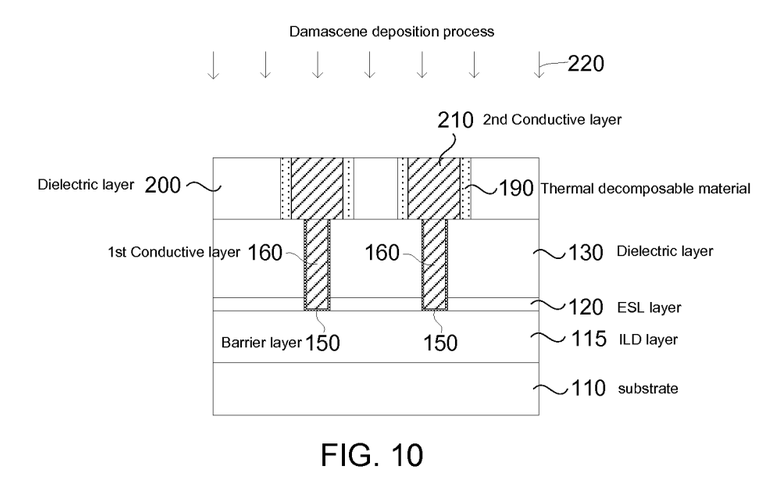

With reference now to FIG. 10, a damascene deposition process 220 is performed on the semiconductor device 100. The damascene deposition process 220 deposits a conductive material in the second openings 205 of the second dielectric layer 200. In one embodiment, the conductive material is copper. In other embodiments, the conductive material may include copper, copper alloy, tungsten, titanium, titanium nitride, or combinations thereof. In one embodiment, the damascene process 220 includes an electroless deposition (ELD) process. In another embodiment, the damascene deposition process 220 includes an electroplating process (ECP). A planarization process that includes a chemical mechanical polishing (CMP) process is subsequently performed after the damascene deposition process 220 so that the top of the conductive material is co-planar with the top of the second dielectric layer 200. The planarization process may alternatively or collectively include an etch back process or other suitable process. As those skilled in the art will recognize, the damascene process could include forming one or more barrier layers and/or seed layers in the second openings 205 prior to depositing the conductive material. As a result of the damascene process and the subsequent CMP process, a plurality of second conductive layer structures 210 are formed in the second openings 205.

Figure 11:
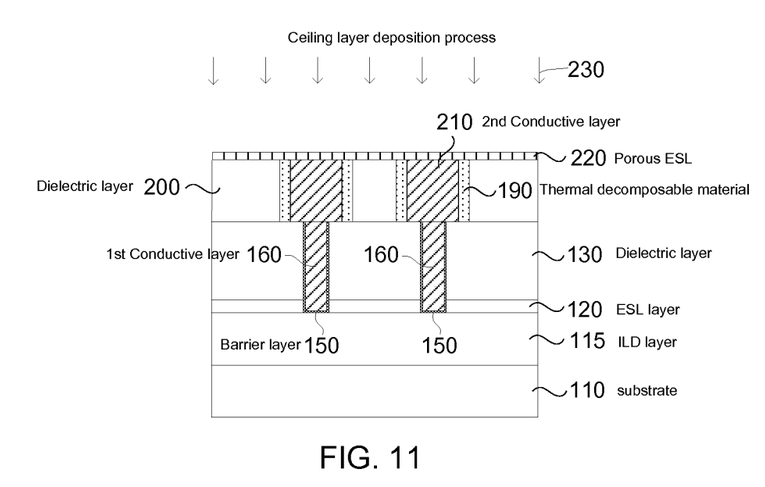

In FIG. 11, a ceiling layer deposition process 230 is performed on the semiconductor device 100 to form a ceiling layer 220 on the second conductive layer structures 210, the energy removable films 190, and the second dielectric layer 200. The ceiling layer 220 has a porous structure such that the energy removal material in the energy removal films 190 can be properly removed at a later step. In one embodiment, the ceiling layer 220 has a porous structure with a dielectric constant ranging from about 2.5 to about 4. In one embodiment, the ceiling layer 220 includes an etch stop layer (ESL) such as silicon nitride, silicon oxynitride, silicon carbide, silicon carbide nitride, other suitable materials, or a combination thereof. The ceiling layer 220 may be substantially similar to the etch stop layer 120 in terms of composition and structure. In another embodiment, the ceiling layer 220 includes a low-k dielectric material layer such as FSG, carbon doped silicon oxide, Xerogel, Aerogel, amorphous fluorinated carbon, Parylene, BCB, SiLK, polyimide, and/or other suitable materials as examples. The ceiling layer 220 may have a thickness ranging between about 10 angstroms and about 500 angstroms. It is understood that the dimensions recited are merely examples, and will change with the down scaling of integrated circuits.

Figure 12:
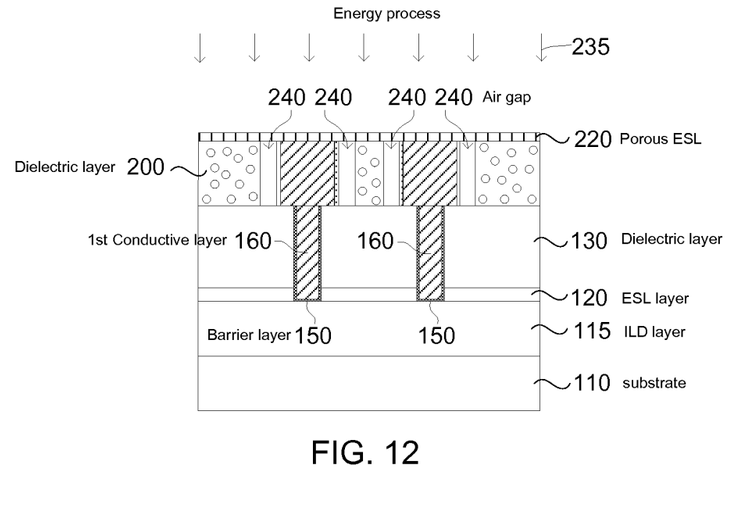

Referring to FIG. 12, an energy process 235 is performed on the semiconductor device 100 to form air gaps 240. The energy process 235 at least partially removes the energy removable films 190, resulting in air gaps 240. The energy applied to the energy removable films 190 include ultraviolet (UV), X-ray, infrared, visual light, thermal energy, electron-beam (e-beam), and/or other suitable energy sources. One exemplary energy source applied to the energy removable films 190 includes e-beam source with electron energy ranging between about 100 eV and about 500 KeV. The energy applied to the energy removable films 190 may have a certain duration in combination with a certain type of energy so that the energy removable films 190 can be at least partially removed to form air gaps 240. In one embodiment, thermal energy is implemented with a temperature ranging between about 100 Celsius and about 600 Celsius and/or a duration from about 1 minute to about 20 minutes. In another embodiment, ultraviolet energy is implemented with a temperature ranging between about 100 Celsius and about 600 Celsius and/or a duration from about 1 minute to about 10 minutes. The energy removable films 190 upon being exposed to the applied energy, is partially removed, resulting in air gaps 240 as illustrated in FIG. 12. In the embodiment as shown in FIG. 12, the air gaps 240 have a slit-type shape. The air gaps 240 are substantially formed in the region formerly occupied by the energy removable films 190 within regions defined by the second conductive layer structures 210 with small spacing. Accordingly, the air gap collapse is prevented. The energy process 235 may, in some embodiments, increase the porosity of second dielectric layer 200, as schematically illustrated by the bubbles in FIG. 12.

The present disclosure provides a structure and a method for making the same in which the air gaps are substantially distributed within the energy removable film regions defined between proximate conductive layer structures or features with small spacing. The air gap collapse is substantially reduced or eliminated accordingly.

The present disclosure may include other variations, extensions, and embodiments without departing from the spirit of the invention. For example, the aforementioned lithography processes may only present a subset of processing steps associated with a lithography patterning technique. The lithography process may further include other steps such as cleaning and baking in a proper sequence. The lithography processes may have other variations. For example, an anti-reflective coating (ARC) layer may be disposed overlying the resist layer, referred to as top ARC (TARC). Other damascene techniques may be used with the energy removal material and the ceiling layer according to the aspects of the present disclosure, in order to form a multilayer interconnect structure with introduced air gaps in the energy removal material, collectively reduced dielectric constant and reduced air gap collapse effect.

The present disclosure has described various exemplary embodiments. According to one embodiment, a method of fabricating a semiconductor device includes providing a substrate. A patterned first dielectric layer is formed on the substrate, the patterned first dielectric layer having a plurality of first openings. A first conductive material is filled in the plurality of first openings, the first conductive material defining first conductive layer structures. A mask layer is formed over the first dielectric layer and the first conductive layer structures. The mask layer includes portions that are each disposed over a respective one of the first conductive layer structures. The width of each of the portions of the mask layer are wider than the width of a respective one of the first conductive layer structures. An energy removable film (ERF) is formed on the sidewalls of each of the portions of the mask layer. A second dielectric layer is formed over the energy removable film, the portions of the mask layer, and the first dielectric layer. The portions of the mask layer are removed to leave behind a plurality of second openings. A second conductive material is filled in the plurality of second openings, the second conductive material defining second conductive layer structures. A ceiling layer is formed on the second conductive layer structures, the energy removable films, and the second dielectric layer. An energy is applied to the substrate to partially remove the energy removable films and form air gaps therefrom.

According to another embodiment, a method of forming a damascene layer includes forming a plurality of first conductive layer structures in a first dielectric layer on a semiconductor substrate. A patterned photoresist layer is formed, wherein the patterned photoresist layer have portions that are each disposed over a respective one of the first conductive layer structures, and further wherein the width of each of the portions of the patterned photoresist layer are wider than the width of a respective one of the first conductive layer structures. An energy removable film (ERF) is formed on the first dielectric layer and on the top and sidewalls of the portions of the patterned photoresist layer. The energy removable film is etched to leave the energy removable film only on the sidewalls of each of the portions of the patterned photoresist layer. A second dielectric layer is formed over the energy removable film, the portions of the patterned photoresist layer, and the first dielectric layer. The portions of the patterned photoresist layer are removed to leave behind a plurality of openings. A conductive material is filled in the plurality of openings, the conductive material defining second conductive layer structures. A ceiling layer is formed over the second conductive layer structures, the energy removable films, and the second dielectric layer. Energy is applied to the substrate to partially remove the energy removable films on the sidewalls of the portions of the photoresist layer to form air gaps therefrom.

According to yet another embodiment, a semiconductor device includes a plurality of first metal layer structures disposed in a first dielectric layer on a semiconductor substrate. A plurality of second metal layer structures are disposed in a second dielectric layer, wherein each of the plurality of second metal layer structures are disposed over a respective one of the plurality of first metal layer structures, and further wherein the width of each of the second metal layer structures being wider than the width of a respective one of the first metal layer structures. An energy removable film is disposed on the sidewalls of the second metal layer structures. An air gap is disposed between the energy removable films on the sidewalls of the second metal layer structures and the second dielectric layer. A ceiling layer is formed over the second metal layer structures, the energy removable films, and the second dielectric layer.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of fabricating a semiconductor device, comprising:

providing a substrate;

forming a patterned first dielectric layer on the substrate, the patterned first dielectric layer having a plurality of first openings;

filling a first conductive material in the plurality of first openings, the first conductive material defining first conductive layer structures;

forming a mask layer over the first dielectric layer and the first conductive layer structures, wherein the mask layer includes portions that are each disposed over a respective one of the first conductive layer structures, a width of each of the portions of the mask layer being wider than a width of a respective one of the first conductive layer structures;

forming an energy removable film (ERF) on sidewalls of each of the portions of the mask layer;

forming a second dielectric layer over the energy removable film, the portions of the mask layer, and the first dielectric layer;

removing the portions of the mask layer to leave behind a plurality of second openings;

filling a second conductive material in the plurality of second openings, the second conductive material defining second conductive layer structures;

forming a ceiling layer on the second conductive layer structures, the energy removable film, and the second dielectric layer; and applying energy to the substrate to at least partially remove the energy removable film and form air gaps therefrom.

2. The method of claim 1, further comprising:
prior to filling the first conductive material in the plurality of first openings, forming a barrier layer on the patterned first dielectric layer and within the first openings.

3. The method of claim 1, further comprising:
planarizing the first conductive material so that a top of the first conductive material is co-planar with a top of the first dielectric layer after the step of filling the first conductive material in the plurality of first openings.

4. The method of claim 1, wherein the mask layer is a patterned photoresist layer.

5. The method of claim 4, wherein the patterned photoresist layer includes a bottom anti-reflective coating (BARC) layer.

6. The method of claim 1, wherein forming the energy removable film comprises forming a material selected from the group consisting of a photonic decomposable material, a thermal decomposable material, an e-beam decomposable material, and a combination thereof.

7. The method of claim 1, wherein forming the ceiling layer comprises forming a material layer selected from the group consisting of an etch stop layer, a low-k dielectric material layer, and combinations thereof.

8. The method of claim 1, wherein forming the ceiling layer comprises forming a porous material layer.

9. The method of claim 1, wherein forming the ceiling layer comprises forming a porous silicon nitride or carbide layer with a dielectric constant ranging from about 2.5 to about 4.

10. The method of claim 1, wherein applying energy to the substrate comprises utilizing one type of energy selected from the group consisting essentially of thermal energy, X-ray, ultraviolet (UV) light, infra-red light, and combinations thereof.

11. The method of claim 10, wherein the energy applied to the substrate is a thermal energy having a temperature ranging between about 100 Celsius and about 600 Celsius for a duration of from about 1 minute to about 20 minutes.

12. The method of claim 1, wherein after applying the energy to the substrate, the second dielectric layer comprises a porous structure with a porosity ranging between about 0.5% and about 80%.

13. A method of forming a damascene layer, comprising:
forming a plurality of first conductive layer structures in a first dielectric layer on a semiconductor substrate;
forming a patterned photoresist layer, the patterned photoresist layer having portions that are each disposed over a respective one of the first conductive layer structures, and further wherein a width of each of the portions of the patterned photoresist layer is wider than a width of a respective one of the first conductive layer structures;
forming an energy removable film (ERF) on the first dielectric layer and on a top and sidewalls of the portions of the patterned photoresist layer;
etching the energy removable film to leave the energy removable film only on the sidewalls of each of the portions of the patterned photoresist layer;
forming a second dielectric layer over the energy removable film, the portions of the patterned photoresist layer, and the first dielectric layer;
removing the portions of the patterned photoresist layer to leave behind a plurality of openings;
filling a conductive material in the plurality of openings, the conductive material defining second conductive layer structures;
forming a ceiling layer over the second conductive layer structures, the energy removable film, and the second dielectric layer; and
applying energy to the substrate to at least partially remove the energy removable film to form air gaps therefrom.

14. The method of claim 13, further comprising:
forming a barrier layer between the first conductive layer structures and the first dielectric layer.

15. The method of claim 13, wherein forming the energy removable film comprises forming a material selected from the group consisting of a photonic decomposable material, a thermal decomposable material, an e-beam decomposable material, and a combination thereof.

16. The method of claim 13, wherein applying energy to the substrate comprises utilizing one type of energy selected from the group consisting of thermal energy, X-ray, ultraviolet (UV) light, infra-red light, and combinations thereof.

17. The method of claim 13, wherein after applying energy to the substrate, the second dielectric layer comprises a porous structure with a porosity ranging between about 0.5% and about 80%.

18. A semiconductor device, comprising:
a plurality of first metal layer structures disposed in a first dielectric layer on a semiconductor substrate;
a plurality of second metal layer structures disposed in a second dielectric layer, wherein each of the plurality of second metal layer structures is disposed over a respective one of the plurality of first metal layer structures, wherein the first metal layer structures are not disposed in the second dielectric layer, and wherein a width of each of the second metal layer structures is wider than a width of the respective one of the first metal layer structures;
an energy removable residue disposed on sidewalls of the second metal layer structures;
an air gap disposed between the energy removable residue on the sidewalls of the second metal layer structures and the second dielectric layer; and
a ceiling layer formed over the second metal layer structures, the energy removable residue, and the second dielectric layer.

19. The semiconductor device of claim 18, wherein the ceiling layer comprises a porous structure.

20. The semiconductor device of claim 18, wherein the second dielectric layer comprises a porous structure with a porosity ranging between about 0.5% and about 80%.

* * * * *